United States Patent
Yagi et al.

Patent Number: 6,109,507
Date of Patent: Aug. 29, 2000

[54] METHOD OF FORMING SOLDER BUMPS AND METHOD OF FORMING PREFORMED SOLDER BUMPS

[75] Inventors: Harumi Yagi; Noritsugu Ozaki; Tsuyoshi Yamamoto; Toshiyuki Nakada; Takeshi Komiyama; Yoshihito Okuwaki, all of Kawasaki, Japan

[73] Assignee: Fujitsu Limited, Kawasaki, Japan

[21] Appl. No.: 09/079,521

[22] Filed: May 15, 1998

[30] Foreign Application Priority Data

Nov. 11, 1997 [JP] Japan .................................. 9-308802

[51] Int. Cl.⁷ .............................. B23K 31/02; H05K 3/32
[52] U.S. Cl. ................................ 228/180.22; 228/180.22; 228/254; 228/248.1; 29/840; 437/183
[58] Field of Search ............................ 228/248.1, 180.22, 228/254, 39, 245; 427/96; 205/118; 437/183, 189; 438/613; 29/840

[56] References Cited

U.S. PATENT DOCUMENTS

| | | | |
|---|---|---|---|
| 5,251,806 | 10/1993 | Agarwala et al. | 228/180.22 |
| 5,346,118 | 9/1994 | Degani et al. | 228/180.22 |
| 5,641,113 | 6/1997 | Somaki et al. | 228/180.22 |
| 5,672,260 | 9/1997 | Carey et al. | 205/118 |
| 5,672,542 | 9/1997 | Schweibert et al. | 437/183 |
| 5,825,629 | 10/1998 | Hoebener et al. | 361/777 |
| 5,912,505 | 6/1999 | Itoh et al. | 257/737 |

FOREIGN PATENT DOCUMENTS 247323  7/1987  European Pat. Off. .............. 228/180

*Primary Examiner*—Patrick Ryan
*Assistant Examiner*—Lynne Edmondson
*Attorney, Agent, or Firm*—Armstrong, Westerman, Hattori, McLeland & Naughton

[57] ABSTRACT

A method of forming solder bumps on pads provided on a board, wherein a plurality of solder bump layer forming cycles are repeatedly implemented. Each of the solder bump layer forming cycles includes the steps of printing solder paste on the board using a mask having mask openings and heating the solder paste so as to fuse the solder paste for forming solder bumps.

8 Claims, 19 Drawing Sheets

FIG. 11
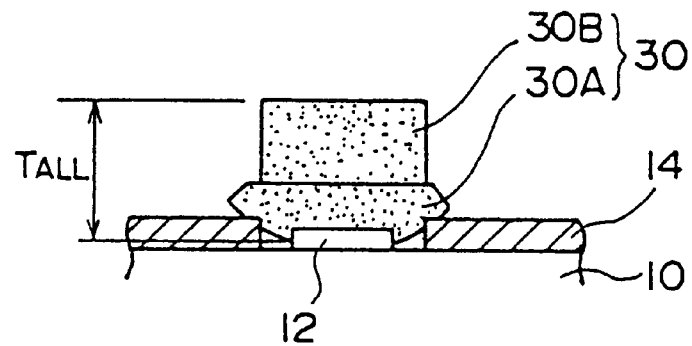
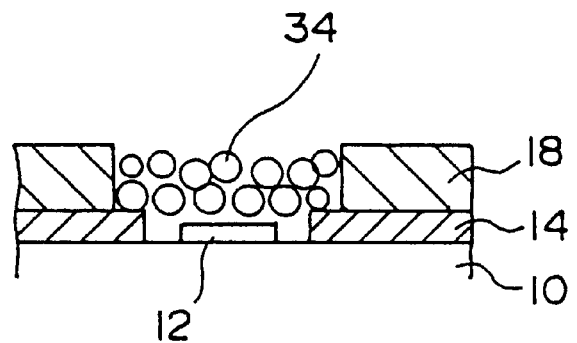
FIG. 12A
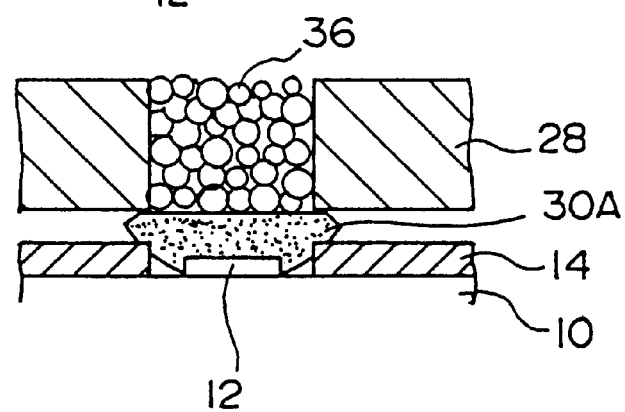
FIG. 12B

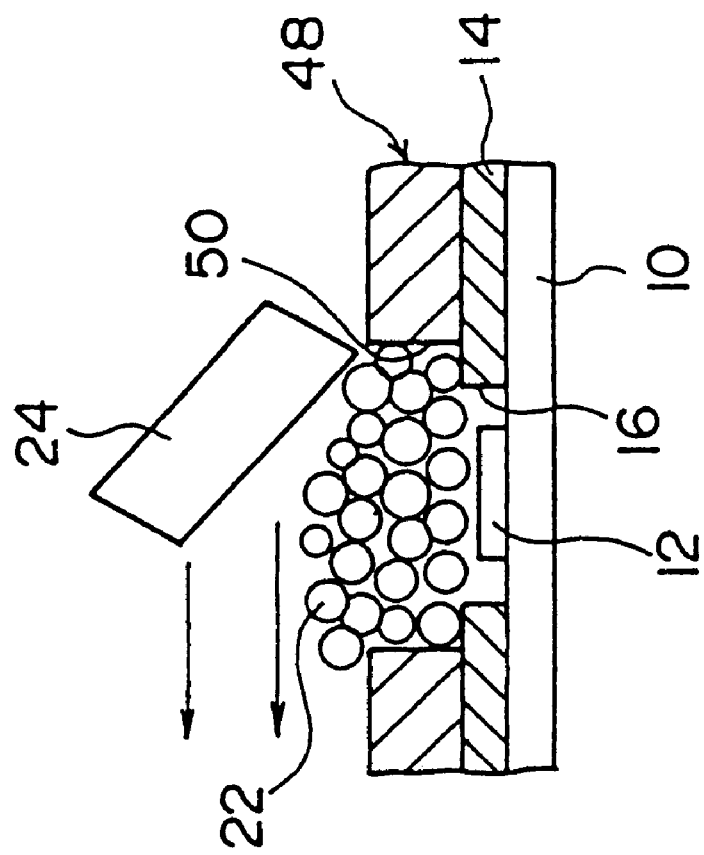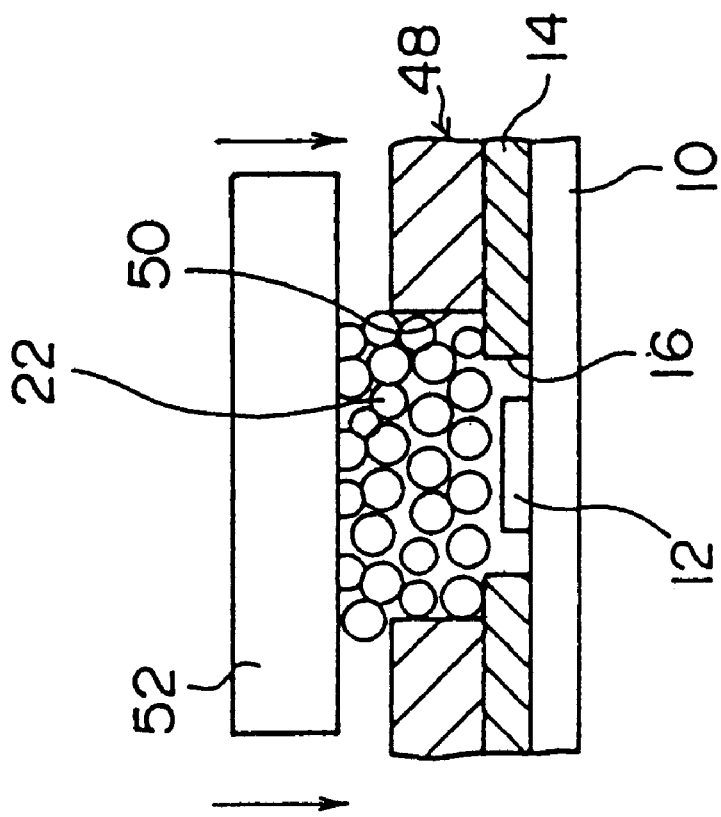

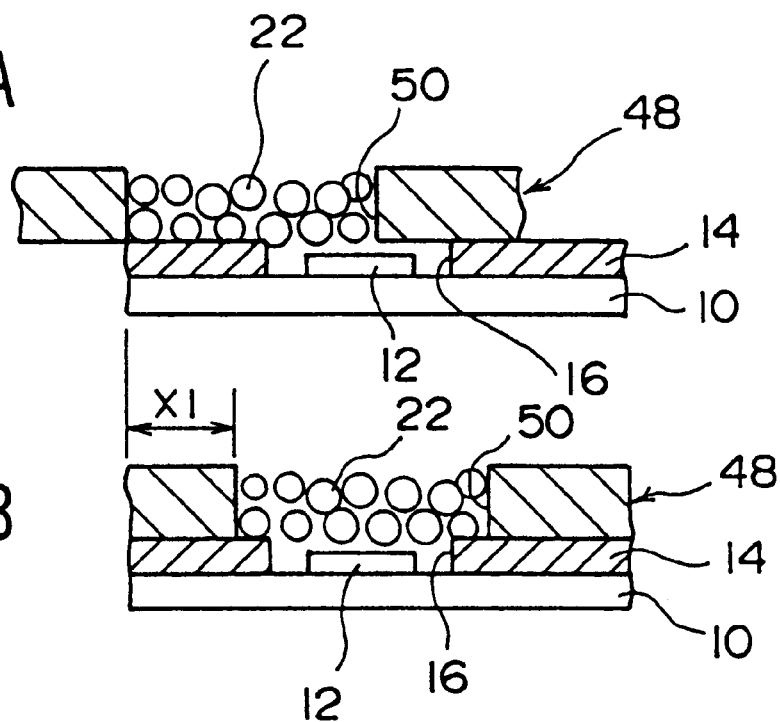

METHOD OF FORMING SOLDER BUMPS AND METHOD OF FORMING PREFORMED SOLDER BUMPS

BACKGROUND OF THE INVENTION

1. Field of the Invention

The present invention generally relates to a method of forming solder bumps and a method of forming preformed solder bumps, and particularly relates to a method of forming solder bumps and a method of forming preformed solder bumps by heat fusion of a printed solder paste.

2. Description of the Related Art

In the related art, several methods are known for forming solder bumps on a semiconductor device and a circuit board. Those methods may be a solder plating method, a method using solder paste and a method using solder balls. A method of forming solder bumps using solder paste is widely employed since solder bumps may be formed by a screen printing process which requires simple equipment and a low cost.

Along with the recent miniaturization of circuit elements, solder bumps have become increasingly small and their pitch has become increasingly fine. Also, in order to mount the circuit elements accurately, solder bumps are required to be formed with high reliability.

Therefore, a method of forming solder bumps is required which can form solder bumps easily with high reliability.

Referring to FIGS. 1 to 4, an example of a method of forming solder bumps according to the related art will be described. In the following, the related art will be described in detail by way of an example of a method of forming solder bumps 102 on a semiconductor chip 100.

FIG. 1 shows the semiconductor chip 100. Here, the solder bumps 102 are not yet formed on the semiconductor chip 100. The semiconductor chip 100 is provided with a plurality of electrodes 104 on a mounting side of a supporting board 106. The term mounting side is to mean a surface of the supporting board which is to be mounted on a mounting board. In order to form the solder bumps 102 on the semiconductor chip 100, as shown in FIG. 2, first, a mask 108 is formed on the surface of the supporting board 106 provided with the electrodes 104. The mask 108 is provided such that mask openings 110 are formed at positions where the electrodes 104 are formed (i.e., where the solder bumps 102 will be formed in the following process).

After the mask 108 has been provided on the supporting board 106, solder paste 112 is provided in the mask openings 110 formed in the mask 108, as shown in FIG. 3. A screen printing process may be utilized as a method of providing the solder paste 112 in the mask openings 110. The solder paste 112 is provided on the electrodes 104 by filling the mask openings 110 with the solder paste 112.

Then, after removing the mask 108 from the supporting board 106, the semiconductor chip 100 is subjected to a heating process in a reflow oven. In this process, an organic paste contained in the solder paste 112 evaporates and solder particles are fused, so that the solder bumps 102 are formed. Thus, as shown in FIG. 4, the semiconductor chip 100 having the solder bumps 102 is formed.

The semiconductor chip 100 provided with the solder bumps 102 is mounted on the mounting board by flip-chip mounting. In order to achieve a high reliability mounting, the solder bumps 102 are required to have a certain height. In other words, if the height of the solder bumps 102 is too small, the solder bumps 102 cannot eliminate an irregularity caused by, for example, a roughness of the surface of the mounting board or a deformation of the mounting board due to thermal expansion. In such a case, there arises a problem of a bad connection.

In the related art, a height of the solder bumps 102 is determined by a thickness of the mask 108 (hereinafter, the thickness T) and a diameter of the mask openings 110 formed in the mask 108 (hereinafter, the diameter L). That is to say, the solder bumps 102 having a greater height may be formed with a larger thickness T and a larger diameter L.

However, when the thickness T of the mask 108 is too large, there may be a problem in the screen printing process that the mask openings 110 are not sufficiently filled with the solder paste 112.

Also, when the diameter L of the mask openings 110 is too large, the neighboring mask openings 110 cannot be closely situated. Thereby the distance between the neighboring solder bumps 102 becomes large, and a problem arises that the pitch of the solder bumps 102 may not be fine.

SUMMARY OF THE INVENTION

Accordingly, it is a general object of the present invention to provide a method of forming solder bumps and a method of forming preformed solder bumps which can solve the problems described above.

It is another and more specific object of the present invention to provide a method of forming solder bumps and a method of forming preformed solder bumps which can achieve a high reliability mounting of a semiconductor chip.

In order to achieve the above objects according to the present invention, in a method of forming solder bumps on pads provided on a board, a plurality of solder bump layer forming cycles are repeatedly implemented. Each of the solder bump layer forming cycles includes the steps of:

a) printing solder paste on the board using a mask having mask openings; and b) heating the solder paste so as to fuse the solder paste for forming solder bumps.

In the method described above, the overall height of the solder bumps may be increased since the solder bumps thus formed are formed of a plurality of solder bump layers. Also, the thickness of the mask used in each of the solder paste printing steps may be smaller than the overall height of the solder bumps. Therefore, the solder paste can be positively filled in the mask openings.

It is still another object of the present invention to provide a method of forming solder bumps which can positively laminate the solder bump layer formed in the subsequent solder bump layer forming cycle.

In order to achieve the above object, the solder bump layer forming cycle further includes a step of:

c) flattening an upper surface of the solder bump layer after the step b).

It is yet another object of the present invention to provide a method of forming solder bumps which can form solder layers having an appropriate height for each layer.

In order to achieve the above object, the thickness of the mask is different between each cycle of the solder bump layer forming cycles.

It is yet another object of the present invention to provide a method of forming solder bumps which can form solder bumps having a greater height within a short period of time.

In order to achieve the above object, the thickness of at least the mask used in the first solder bump layer forming cycle is smaller than a thickness of the mask used in the subsequent solder bump layer forming cycles.

Generally, the pad on the board is formed of a metal other than solder. Therefore, the adhesiveness between the pad and the solder bump layer is smaller than the adhesiveness between the solder layers. Also, in such a case, it is known to reduce the thickness of the solder bump layer in order to increase the adhesiveness.

Accordingly, the pad and the solder bump layer can be positively joined by utilizing a thin mask in the first cycle.

After the first cycle, the solder bump layers may be positively joined using comparatively thick masks, since the layers are both formed of solder having high adhesiveness. Further, by using a thick mask, the thickness of the solder bump layers formed after the first cycle may be comparatively large.

Also, in order to achieve the above object, the characteristics of the solder paste are different between each cycle of the solder bump layer forming cycles.

Further, in order to achieve the above object, a fluidity of the solder paste is increased as the number of cycles of repetition of the solder bump layer forming cycles increases.

In such a case, the bottom layer is formed of a solder paste having low fluidity (i.e., high viscosity) so that the adhesiveness against the pad is improved. The higher layers may be more fluid since the adhesiveness between the solder layers is improved in the higher layers. Further, because of the higher fluidity of the solder paste, an amount of the solder bumps which can be filled in the solder paste printing step is increased. Therefore, a solder bump layer can be formed with a greater height.

It is yet another object of the present invention to provide a method of forming solder bumps which can form solder layers which have areas appropriate for each layer.

In order to achieve the above object, the area of the mask openings of the mask is different between each cycle of the solder bump layer forming cycles.

It is yet another object of the present invention to provide a method of forming solder bumps which can form solder bumps having a greater height within a short period of time.

In order to achieve the above object, the area of the mask opening is reduced as the number of cycles of repetition of the solder bump layer forming cycles increases.

In such a case, the adhesiveness between the solder bump layer and the pad is improved since the area of the mask opening in the lower layers is larger and thus the area of the provided solder paste is also larger.

Also, since the adhesiveness between the solder layers is greater in the higher layers, the solder bump layers may be positively joined even if the area of the mask openings and the area of the solder layers are smaller.

When the same amount of the solder paste is filled in the mask openings for the lower layer and the upper layer, the upper layer may have a greater height by reducing the area of the mask openings in the upper layer. Therefore, it is possible to form a solder bump layer having a greater height at the upper layer.

It is yet another object of the present invention to provide a method of forming preformed solder bumps which can positively form preformed solder bumps having a predetermined shape.

In order to achieve the above object, a method of forming preformed solder bumps on a mounting board, the mounting board intended for a semiconductor chip having solder bumps to be mounted thereon and provided with a resist layer having resist openings at positions corresponding to the solder bumps, includes the steps of:

d) printing the solder paste on the mounting board using a mask having mask openings at positions corresponding to the position of the solder bumps; and e) heating the solder paste so as to fuse the solder paste for forming preformed solder bumps after the step d).

In order to facilitate the removal of the mask from the mounting board after the step d), a mask used in the step d) is formed with mask openings having a larger area than an area of resist openings. Accordingly, the solder paste is prevented from remaining on the mask upon removal of the mask.

It is yet another object of the present invention to provide a method of forming preformed solder bumps which can improve the filling efficiency of the solder paste in both the resist openings and the mask openings.

In order to achieve the above object, the solder paste is filled in the resist openings and the mask openings and is pressed towards the mounting board during the step d).

Accordingly, the amount of the solder paste filled in both the resist openings and the mask openings will be constant. Therefore, a plurality of preformed solder bumps may be formed with the same height.

It is yet another object of the present invention to provide a method of forming preformed solder bumps which can improve the filling efficiency of the solder paste in the mask openings.

In order to achieve the above object, a diameter R of solder particles included in the solder paste is determined so as to satisfy a relationship $L/8<R<L/5$, where the diameter of the mask openings is L.

When the diameter R of the solder particles is too large, a considerably large amount of gaps may occur between the solder particles and thus the filling amount of the solder paste will decrease. Also, when the diameter R of the solder particles is too small, the filling amount of the solder paste increases, but the fluidity of the solder paste will decrease. Therefore, the mask openings will not be sufficiently filled with the solder paste and thus the filling amount of the solder paste will also decrease.

By determining the diameter R of the solder particles so as to satisfy the above relationship $L/8<R<L/5$, both of the above problems may be solved.

It is yet another object of the present invention to provide a method of forming preformed solder bumps which can improve the filling efficiency of the solder paste.

In order to achieve the above object, a thickness of the mask T and the diameter L of the mask openings are determined so as to satisfy the relationship expressed as $1.5 \times T < L$.

The filling ability of the solder paste is related to the diameter L of the mask openings and the thickness T of the mask. For example, when the thickness of the mask is increased while the diameter of the mask openings is kept constant, the filling efficiency of the solder paste will decreased when the thickness of the mask exceeds the predetermined value. Accordingly, by satisfying the above relationship, the thickness of the mask in relationship to the mask opening will be appropriate.

It is yet another object of the present invention to provide a method of forming preformed solder bumps which can prevent the void being produced in the preformed solder bumps.

In order to achieve the above object, the mask openings are provided so as to be displaced from the resist openings when providing the mask on the mounting board in the step d).

Typically, the solder paste is printed on the whole area of the top surface of the mounting board when the resist openings and the mask openings are aligned. The top surface of the pad is slightly rough and includes air, which may cause the void. Therefore, when the solder paste is printed in such a state, the air will be sealed by the solder paste in the roughness on the top surface of the pad. Thus, the void is produced in the preformed solder bumps in the subsequent heating step. Therefore, the quality of the preformed solder bumps is degraded.

If the resist openings and the mask openings are displaced, the pad is not covered with solder paste after the solder paste printing step. In the heating step, the fused solder flows in the openings so as to form the preformed solder bumps on the pad. When the fused solder flows in the openings, the air existing on the top surface of the pad will be pushed away by the solder. Thereby, the void is prevented from being produced in the preformed solder bumps.

Other objects and further features of the present invention will be apparent from the following detailed description when read in conjunction with the accompanying drawings.

BRIEF DESCRIPTION OF THE DRAWINGS

FIG. 11 is a cross-sectional diagram showing a solder bump formed by the first embodiment of the method of forming solder bumps according to the present invention.

FIG. 12A is a cross-sectional diagram showing a state after completion of a first solder paste printing step in a second embodiment of the method of forming solder bumps according to the present invention.

FIG. 12B is a cross-sectional diagram showing a state after completion of a second solder paste printing step in the second embodiment of the method of forming solder bumps according to the present invention.

FIGS. 16A and 16B are cross-sectional diagrams showing a pressing process implemented in a solder paste printing step of the first embodiment of the method of forming preformed solder bumps according to the present invention.

FIGS. 23A and 23B are cross-sectional diagrams showing a second embodiment of the method of forming preformed solder bumps according to the present invention.

DETAILED DESCRIPTION OF THE PREFERRED EMBODIMENTS

In the following, a principle and an embodiment of the present invention will be described with reference to the accompanying drawings.

Figure 1:
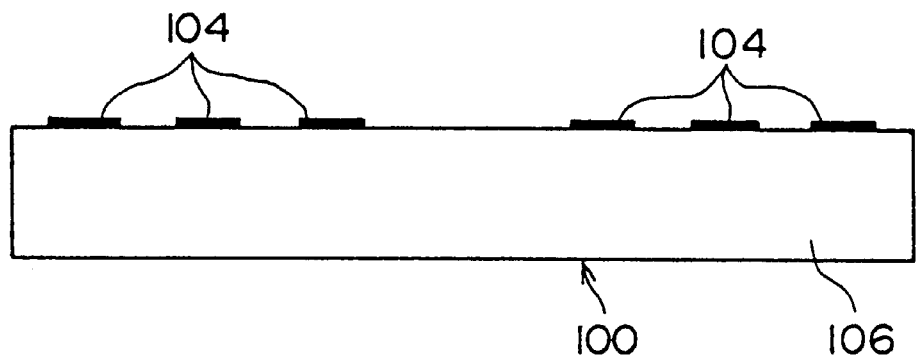
FIGS. 1 to 4 are cross-sectional diagrams showing an example of a method of forming solder bumps according to the related art.
Figure 2:
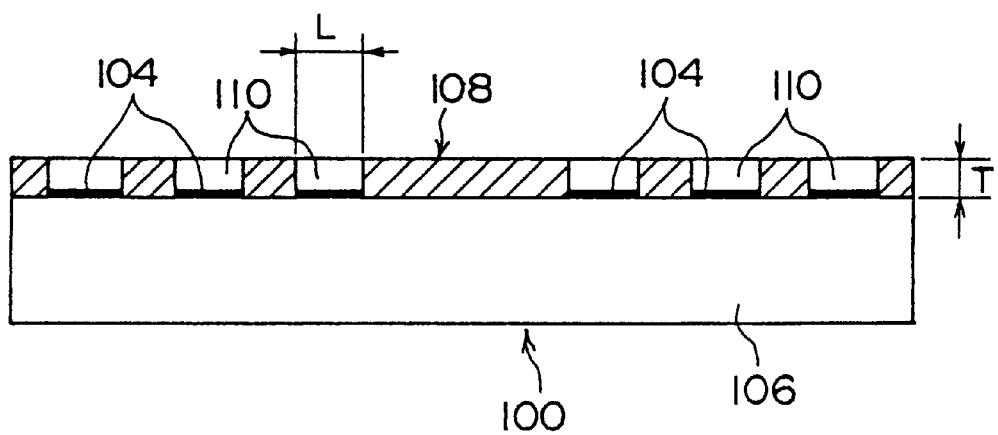
Figure 3:
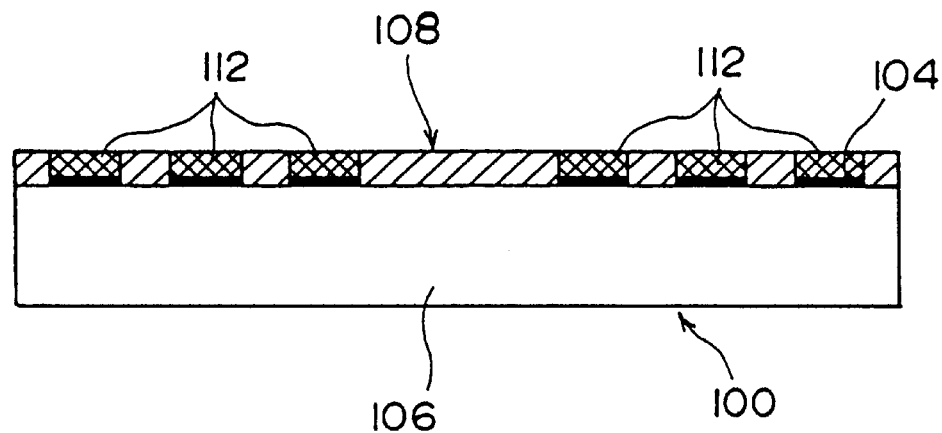
Figure 4:
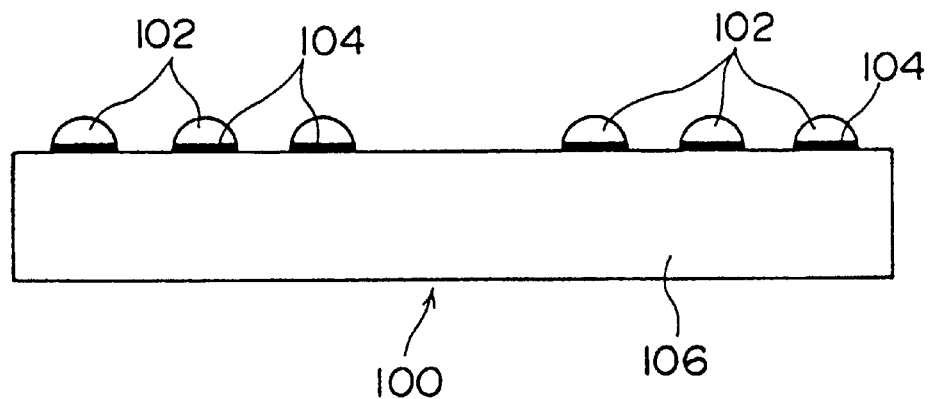
Figure 5:
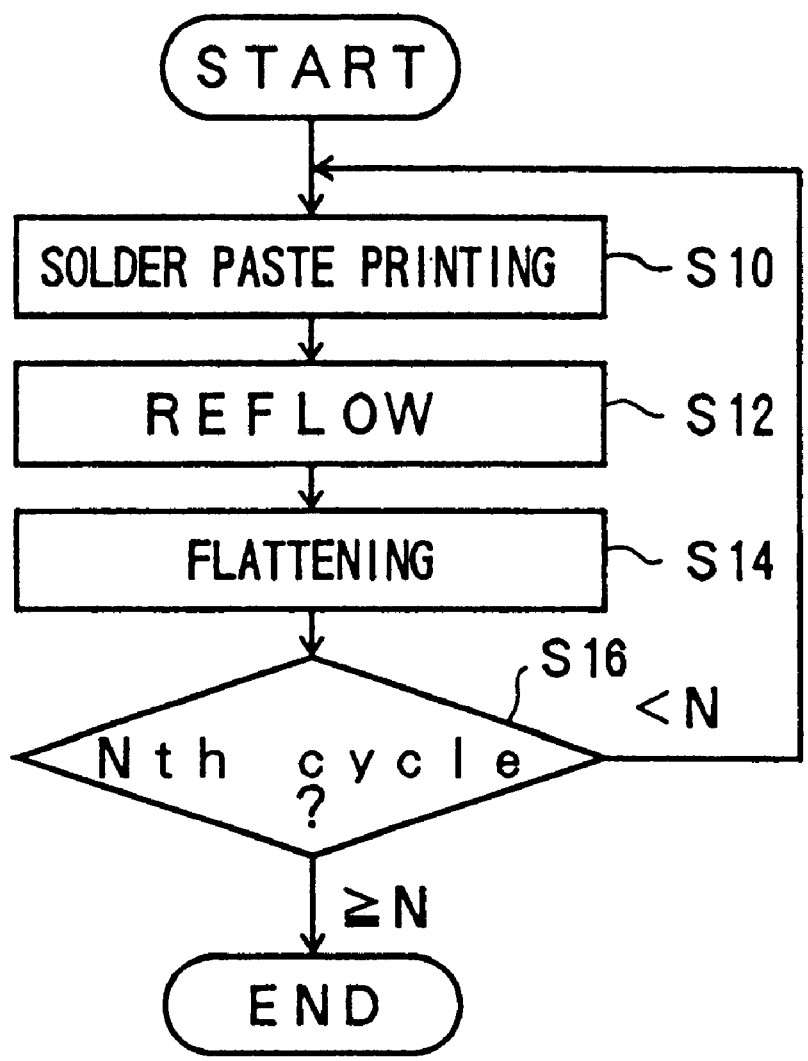
FIG. 5 is a flowchart showing an example of a method of forming solder bumps according to the present invention.

FIG. 5 is a flowchart showing steps implemented in a first embodiment of a method of forming solder bumps of the present invention. FIGS. 6 to 11 are detailed diagrams showing each step implemented in the method of forming the solder bumps. In the following, a method of forming solder bumps will be described by referring to an example of forming solder bumps 30 on a mounting board (hereinafter referred to as a board) 10 on which a semiconductor chip is to be mounted. However, a method of forming solder bumps described below also applies to a case where solder bumps are formed on a semiconductor chip.

According to the present embodiment, as shown in FIG. 5, first, solder paste 22 is printed on the board 10 in step 10 (in the figure, a step is denoted by S). This step is referred to as a solder paste printing step.

Figure 6:
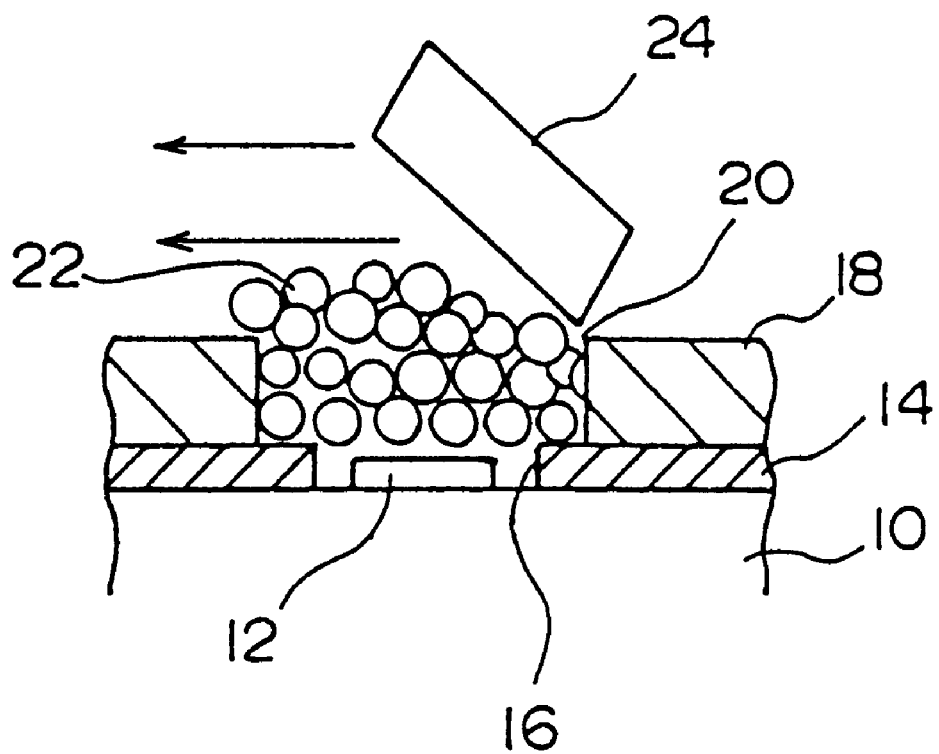
FIG. 6 is a cross-sectional diagram showing an example of the method of forming solder bumps according to the present invention.

FIG. 6 is a diagram showing the solder paste printing step in detail. As shown in FIG. 6, a first mask 18 is provided on an upper surface of the board 10 in order to print the solder paste 22 on the board 10. Then, using a squeegee 24, the solder paste 22 is filled in a mask opening 20 formed in the first mask 18.

The board 10 is provided with a pad (electrode) 12 and a resist 14, whereon a solder bump 30 will be formed. The pad 12 is integrated in a wiring having a predetermined pattern which is formed of a conductive metal.

The resist 14 is for example a layer formed of an insulating resin having a resist opening 16 formed at a position corresponding to the pad 12. Therefore, the pad 12 is exposed externally through the resist opening 16 formed in the resist 14. Other wiring parts are protected by the resist 14.

The solder paste 22 is formed by mixing solder particles having a predetermined particle diameter (described later) into a flux made of an organic material. Since this solder paste 22 is fluid (or viscous), the solder paste 22 may be filled in the mask opening 20 by sliding the squeegee 24 in the direction of arrows shown in FIG. 6.

Figure 7:
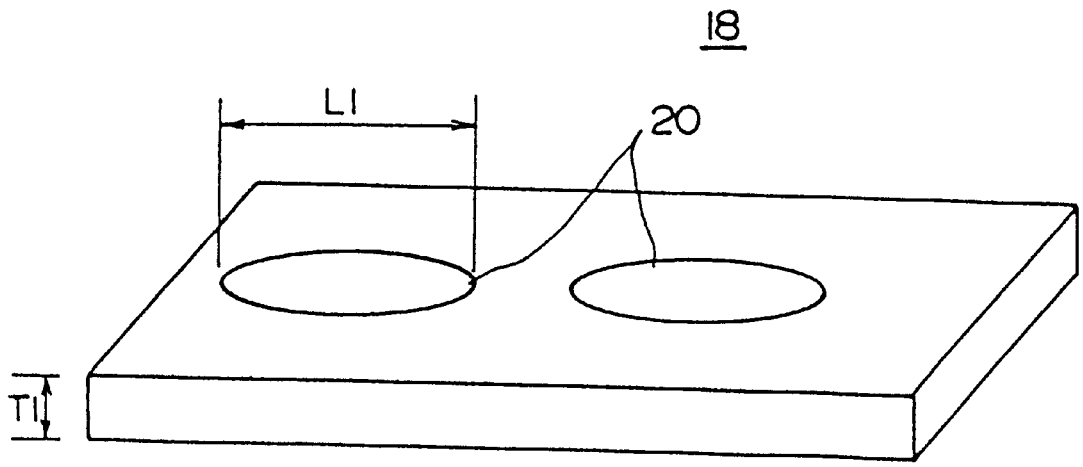
FIG. 7 is a perspective view of a mask used in a first embodiment of the method of forming solder bumps according to the present invention.

As shown in FIG. 7, the first mask 18 has a flat shape with a plurality of the mask openings 20 (only two of which are shown) formed therein. A thickness T1 of the first mask 18 and a diameter L1 of the mask opening 20 is to satisfy the relationship expressed as $1.5 \times T1 < L1$.

The above relationship between the thickness T1 and the diameter L1 is determined from the following reason. The filling efficiency of the solder paste 22 is mutually related with the diameter L1 and the thickness T1. For example, a case is considered where the thickness T1 is increased while the diameter L1 is kept constant, and the thickness T1 exceeds the predetermined value (i.e., the mask opening 20 is too deep). In such a case, it is difficult to fill in the solder paste 22 to the bottom of the mask opening 20 using the squeegee 24. Accordingly, the filling efficiency of the solder paste 22 is decreased in the mask opening 20.

Conversely, a case is considered where the diameter L1 of the mask opening 20 is decreased while the thickness T1 is kept constant, and further the diameter L1 falls below the predetermined value (i.e., an area of the mask opening 20 is too small). In such a case, it is difficult to positively fill the solder paste 22 in the mask opening 20 using the squeegee 24. Therefore, again, the filling efficiency of the solder paste 22 is reduced in the mask opening 20.

Figure 9:
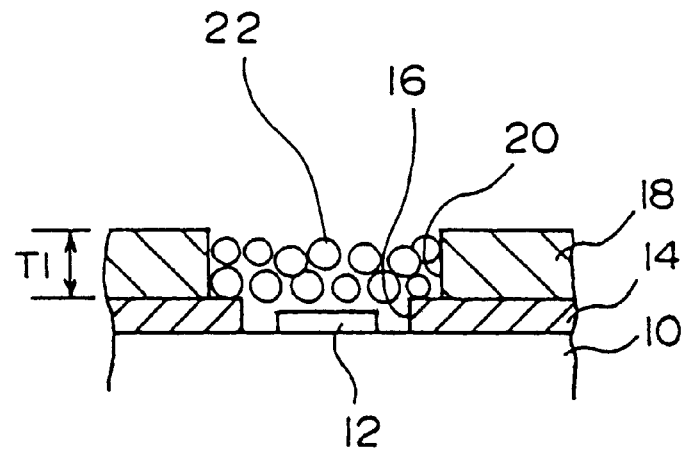
FIG. 9 is a cross-sectional diagram showing a state after completion of a first solder paste printing step in the first embodiment of the method of forming solder bumps according to the present invention.

From the result of an experiment carried out by the inventors, it can be seen that the filling efficiency of the solder paste 22 in the mask opening 20 is improved when the relationship between the mask thickness T1 and the diameter L1 of the mask opening 20 can be expressed as $1.5 \times T1 < L1$. FIG. 9 is a diagram showing a state where the mask opening 20 is filled with the solder paste 22.

After completion of the solder paste printing step (step 10) shown in FIG. 5, the first mask 18 is removed from the board 10. Then, the board 10 is mounted in the reflow oven so as to be subjected to a reflow process, or heating step (step 12).

Figure 8:
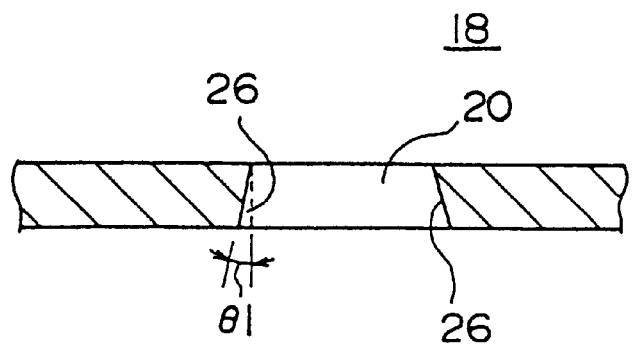
FIG. 8 is a cross-sectional diagram of a mask used in the first embodiment of the method of forming solder bumps according to the present invention.

In order to facilitate the removal of the first mask 18 from the board 10, it is advantageous for the mask opening 20 to have a tapered surface 26 as shown in FIG. 8. Thus, the solder paste 22 is prevented from remaining on the first mask 18 upon removal. The most effective angle of inclination of the tapered surface 26 is, for example, 2° to 3°.

Figure 10:
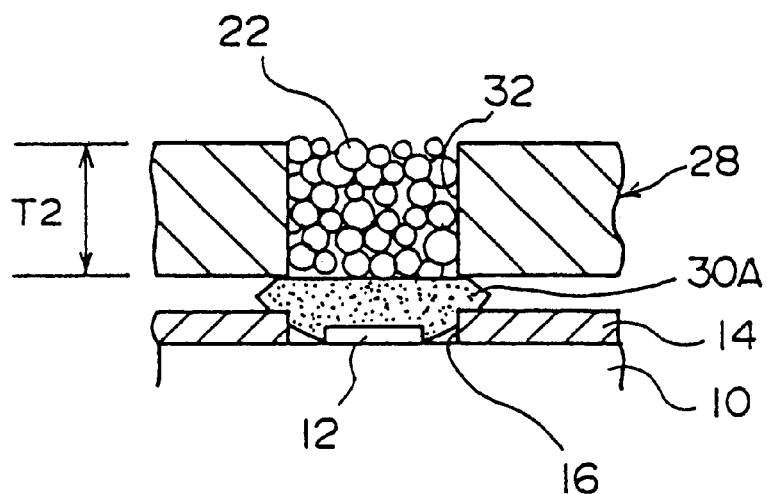
FIG. 10 is a cross-sectional diagram showing a state after completion of a second solder paste printing step in the first embodiment of the method of forming solder bumps according to the present invention.

In the above-described reflow process, the organic flux in the solder paste 22 may evaporate and solder particles may fuse so as to form a lower solder bump layer 30A (see FIG. 10). Note that immediately after the reflow process, the lower solder bump layer 30A has a spherical shape due to the surface tension which has acted during fusion of the solder particles. Accordingly, the lower solder bump layer 30A thus formed will be subjected to a flattening step (step 14 in FIG. 5).

The flattening step is carried out by pressing the upper surface of the lower solder bump layer 30A using a flattening member having a flat shape. This causes a plastic deformation of the upper surface of the lower solder bump layer 30A. The lower solder bump layer 30A is thus flattened.

The first cycle of solder bump layer forming cycles is completed by the above-described process (hereinafter the term cycle may also refer to a solder bump layer forming cycle). As shown in FIG. 5, step 16 is implemented after steps 10 to 14 of the first cycle. In step 16, the number of cycles of the present cycle is determined (hereinafter the determined number of cycles is referred to as an actual number of cycles). Also, it is determined if the actual number of cycles has reached the predetermined number of cycles N.

If, in step 16, the actual number of cycles has not yet reached the predetermined number of cycles, the process returns to step 10 and the steps 10 to 14 are repeated. If the actual number of cycles is determined to have reached the predetermined number of cycles N, the solder bump forming process is completed. The present embodiment will be described by referring to a case where N=2.

FIG. 10 is a diagram showing a state after completion of the solder paste printing step (S10) in the second cycle. As shown in FIG. 10, the lower solder bump layer 30A is formed on the pad 12 provided on the board 10 by implementing the first cycle.

Also, a second mask 28 is formed on the board 10 provided with the lower solder bump layer 30A. A mask opening 32 formed in the second mask 28 may be filled with the solder paste 22 by printing the solder paste 22 as shown in FIG. 6. Then, the reflow process (heating step) at S12 and the flattening step at S14 are implemented so as to form an upper solder bump layer 30B on the lower solder bump layer 30A, as shown in FIG. 11. Thus, the solder bump 30 is formed such that the lower solder bump layer 30A and the upper solder bump layer 30B are laminated.

As described above, in the present embodiment, the reflow process (heating step) is followed by the flattening step for flattening the top surface of the lower solder bump layer 30A. Thereby, the upper solder bump layer 30B formed in the second cycle maybe positively laminated on the lower solder bump layer 30A. Also, the height of the solder bumps 30 may be leveled.

In the present embodiment, the predetermined number of cycles N is determined as N=2. Therefore, after the upper solder bump layer 30B has been formed, the solder bump forming process terminates by the decision made in step 16.

Now a comparison will be made between the first mask 18 used in the first cycle and the second mask 28 used in the second cycle. Here, the thickness of the first mask 18 used in the first cycle is denoted by T1 and the thickness of the second mask 28 used in the second cycle is denoted by T2. As shown in FIGS. 9 and 10, the thickness T2 of the second mask 28 is provided so as to be greater than the thickness of the first mask 18 (T2>T1) in the present embodiment.

Thus, when the solder bump layer forming cycles are repeated, the solder bump layers 30A, 30B each having an appropriate height may be formed by using the masks 18, 28 having different thickness T1, T2. This will be described below.

Since the thickness T1 of the first mask 18 is smaller, the thickness of the lower solder bump layer 30A formed using this first mask 18 will also be smaller. Generally, the pad 12 on the board 10 is formed of a metal other than solder. Therefore, the adhesive strength between the pad 12 and the lower solder bump layer 30A is smaller than the adhesive strength between layers both formed of solder.

In the above case, the adhesive strength against the pad 12 may be increased by reducing the thickness of the lower solder bump layer 30A. When forming the lower solder bump layer 30A, which directly touches the pad 12, the first mask 18 having a small thickness T1 may be used so as to positively join the pad 12 and the lower solder bump layer 30A.

After the first cycle, there is no need to consider the adhesive strength against the pad 12. The adhesive strength between the layers will be greater since each layer is formed of solder. Therefore, even if the thickness T2 of the second mask 28 is larger, the solder layers 30A, 30B may be positively joined. Also, by using the thick second mask 28, the height of the solder bump layer formed in the first solder bump layer forming cycle (i.e., the upper solder layer 30B) may be larger. Thereby, the solder bump 30 having a greater height may be efficiently formed within a short period of time.

As described above, in the present embodiment, a plurality of the solder bump layers 30A, 30B are laminated so as to form the solder bump 30. Therefore, any required height of the solder bumps 30 may be achieved by suitably selecting a number of layers to be laminated (i.e., the above-described predetermined number of cycles N). Thus, it is easy to form the solder bump 30 having the most suitable height for mounting. This improves the mounting ability. Also, the thicknesses T1, T2 of the masks 18, 28 used in the respective solder paste printing step may be smaller than the required overall height $T_{ALL}$ of the solder bump 30. This enables the solder paste 22 to be positively filled in the mask openings 20, 32. Thus, highly reliable solder bumps 30 are formed.

Referring now to FIGS. 12A and B, a second embodiment of a method of forming solder bumps will be described.

FIG. 12A shows a cross-sectional diagram after completion of the solder paste printing step of the first cycle. FIG. 12B shows a cross-sectional diagram after completion of the solder paste printing step of the second cycle. In FIGS. 12A and B, the same elements as those of the structures shown in FIGS. 6 to 11 are shown with the same reference numbers and further description is omitted. This also applies to other embodiments, which will be described later.

The present invention is characterized in that when repeatedly implementing the solder bump layer forming cycles, solder paste 34 and 36 of different characteristics are used. That is to say, the solder paste 34 and 36 have characteristics which are appropriate for forming solder bump layers 30A, 30B, respectively. This will be described in detail in the following.

In the present embodiment, a solder paste with lower fluidity (i.e., higher viscosity) is chosen as the first solder paste 34 used in the first cycle shown in FIG. 12A. On the contrary, a solder paste with higher fluidity (i.e., lower viscosity) compared to the first solder paste 34 is selected as the second solder paste 36 used in the second cycle shown in FIG. 12B.

Accordingly, since the first solder paste 34, which forms a lower layer, has a higher viscosity, the adhesiveness between the pad 12 and the first solder paste 34 is improved. Thereby, the joining force between the lower solder bump layer 30A and the pad 12 may be improved even in a case that the layers are made of different materials.

Also, since the second solder paste 36, which forms an upper layer, is provided on the lower solder bump layer 30A (i.e., solder layers are facing each other), the adhesiveness will be higher. Thereby, the upper solder bump layer 30B may be positively formed even when the second solder paste 36 has a high fluidity and low viscosity.

By giving higher fluidity to the second solder paste 36, an amount of the second solder paste 36 which can be filled in the second cycle is increased compared to an amount of the first solder paste 34 which may be filled in the first cycle. Accordingly, the upper solder bump layer 30B, which is formed on the second solder paste 36, may have a greater height. Thus, a high-back solder bump 30 can be efficiently formed within a short period of time.

In the following, referring to FIGS. 13A and B, a third embodiment of a method of forming solder bumps according to the present invention will be described.

Figure 13A:
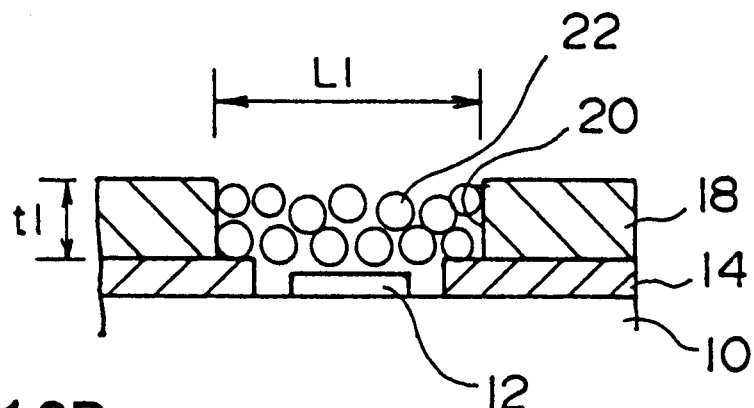
FIG. 13A is a cross-sectional diagram showing a state after completion of a first solder paste printing step in a third embodiment of the method of forming solder bumps according to the present invention.
Figure 13B:
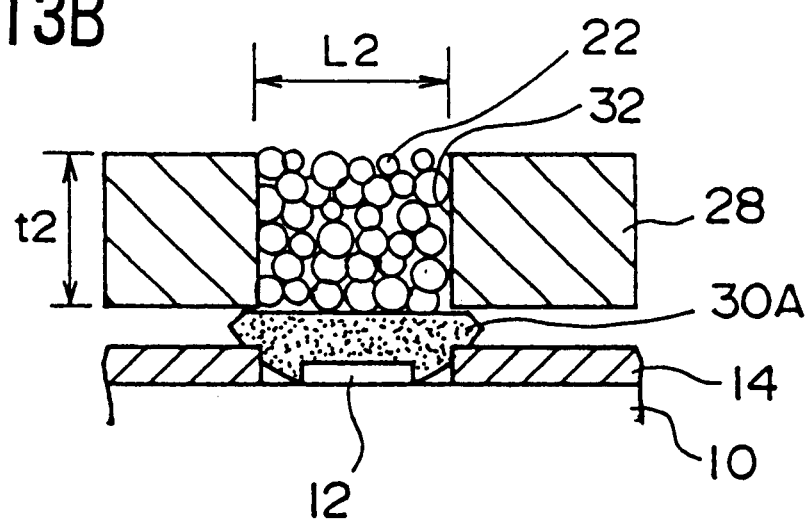
FIG. 13B is a cross-sectional diagram showing a state after completion of a second solder paste printing step in the third embodiment of the method of forming solder bumps according to the present invention.

FIG. 13A shows a cross-sectional diagram after completion of the solder paste printing step of the first cycle in the third embodiment of the method of forming the solder bumps according to the present invention. FIG. 13B shows a cross-sectional diagram after completion of the solder paste printing step of the second cycle in the third embodiment of the method of forming the solder bumps according to the present invention.

The present embodiment is characterized in that when repeatedly implementing the solder bump layer forming cycles, the area of the openings are different between respective masks 18, 28, so as to form the solder bump layers 30A, 30B having areas appropriate for each layer. This will be described in detail.

In the present embodiment, the area of the opening is reduced as the number of cycles of the solder bump layer forming cycles increases. That is to say, the area of the mask opening 32 formed in the second mask 28 used in the second cycle is to be smaller than the area of the mask opening 20 formed in the first mask 18 used in the first cycle.

Here, since the mask openings 20, 32 are circular, the diameters L1 and L2 are used as indications representing the areas of the mask openings 20, 32. Therefore, in the present embodiment, the relationship between the diameters L1, L2 of the mask openings 20, 32 can be expressed as L1>L2.

In the first cycle, the solder paste 22 is printed by using the first mask 18 having openings 20 with a greater area. Thus when the above relationship is maintained, the area for the printed solder paste 22 will also be greater. Therefore, an adhesiveness between the lower solder bump layer 30A thus formed and the pad 12 (or the board 10) can be improved.

Also, since the second solder paste 22, which has a high-back structure as described above, is provided on top of the lower solder bump layer 30A, an adhesiveness between the second solder paste 22 and the lower solder bump layer 30A is improved. Therefore, the solder bump layers 30A and 30B may be positively laminated even in the case where the area of the mask opening 32 of the second mask 28 and the area of the upper solder bump layer 30B are smaller.

Further, the area of the mask opening 32 at the upper layer may be reduced, so as to fill the mask openings 20, 32 at both the upper layer and the lower layer with the same amount of solder paste 22. In such a case, the filling height of the solder paste 22 will be higher in the upper layer since the area of the mask opening is smaller in the upper layer (t2>t1, where t1 is a height of the lower layer and t2 is a height of the upper layer). Thus, the upper solder bump layer 30A may have a high-back structure. Therefore, the solder bump 30 having a greater height may be efficiently formed within a short period of time.

The method of forming solder bumps according to the first, second and third embodiments has been described with reference to FIGS. 5 to 13 which show a method of forming the solder bump 30 having a double layer structure with the lower solder bump layer 30A and the upper solder bump layer 30B. However, the number of layers to be laminated is not limited to two layers and can be three or more. The above-described embodiments are applicable to a structure with three or more layers.

In the following, a method of forming preformed solder bumps according to the present invention will be described.

First, referring to FIGS. 14 to 20, a first embodiment of a method of forming preformed solder bumps will be described. Again, in FIGS. 14 to 20, the same elements as those of the structures shown in FIGS. 5 to 13 are shown with the same reference numbers and further description is omitted.

Figure 14:
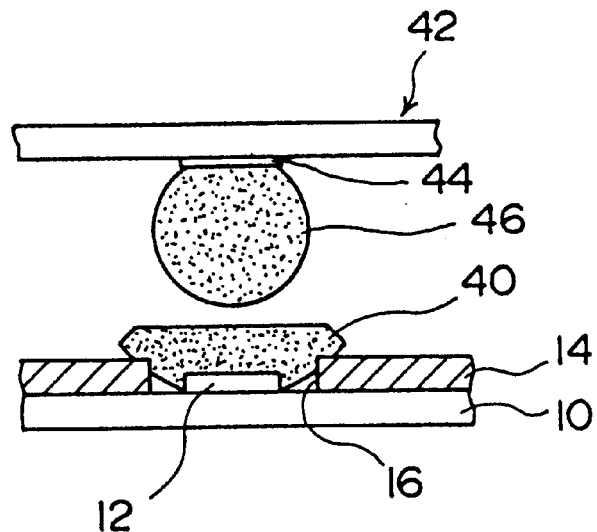
FIG. 14 is a cross-sectional diagram showing a preformed solder bump formed by a first embodiment of a method of forming preformed solder bumps according to the present invention.

FIG. 14 is a cross-sectional diagram showing a preformed solder bump formed by a first embodiment of a method of forming preformed solder bump according to the present invention. The preformed solder bump 40 is provided on the mounting board 10 (in the following, referred to as a board 10) whereon a semiconductor chip 42 is to be mounted. The preformed solder bump 40 serves to improve an electrical connectivity between a solder bump 46 formed on the semiconductor chip 42 and the pad 12 provided on the board 10. Therefore, the preformed solder bump 40 is formed on the pad 12 provided on the board 10.

Figure 15:
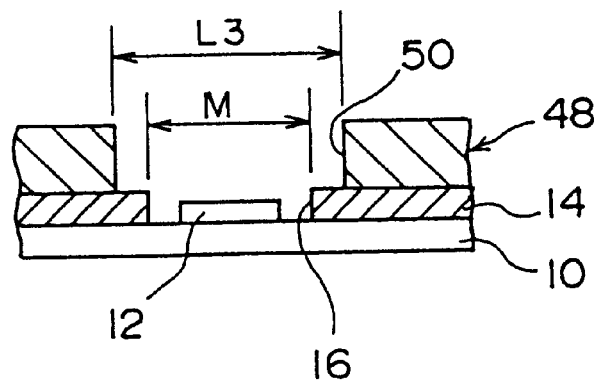
FIG. 15 is a cross-sectional diagram showing a solder printing step of the first embodiment of the method of forming preformed solder bumps according to the present invention.

FIG. 15 shows a first step of forming the preformed solder bump 40 on the board 10. In this step, the solder paste 22 which will form the preformed solder bump 40 is printed on the upper surface of the board 10 (solder paste printing step). In detail, a mask 48 for the preformed solder bump 40 is provided on the upper surface of the board 10, as shown in FIG. 15. A mask opening 50 is formed in the mask 48 at a position corresponding to the pad 12.

The resist 14 is also formed on the upper surface of the board 10, and the resist opening 16 is formed at a position corresponding to the pad 12. In the present embodiment, when providing the mask 48 for the preformed solder bump 40 on the board 10, the mask opening 50 and the resist opening 16 are positioned such that the centers are aligned. Therefore, when the mask 48 is provided on the board 10, the pad 12 is exposed externally through the mask opening 50 and the resist opening 16.

When a diameter of the mask opening 50 is represented by L3 and a diameter of the resist opening 16 is represented by M, the relationship between the diameter L3 and the diameter M can be expressed as L3>M. This will be described later for the sake of clarity.

After the mask 48 has been provided on the board 10 as described above, the solder paste 22 is filled in the mask opening 50 of the mask 48, as shown in FIGS. 16A and B.

As shown in FIG. 16A, the solder paste 22 is excessively provided in the mask opening 50 and pressed with a pressing member 52 towards the board 10. In this manner, the solder paste 22 is forced into the mask opening 50. Then, after the pressing process, the squeegee 24 removes excessive solder paste 22 existing above the top surface of the mask 48.

Accordingly, the filling efficiency of the solder 22 in the resist opening 16 and the mask opening 50 is improved by implementing the above pressing process in the solder paste printing step. Thus, the amount of the solder paste 22 filled in the resist opening 16 and the mask opening 50 will be constant. Therefore, the preformed solder bumps 40 formed by the following heating step will be uniform (the number of the preformed solder bumps thus formed depends on the number of the solder bumps 46).

Figure 17:
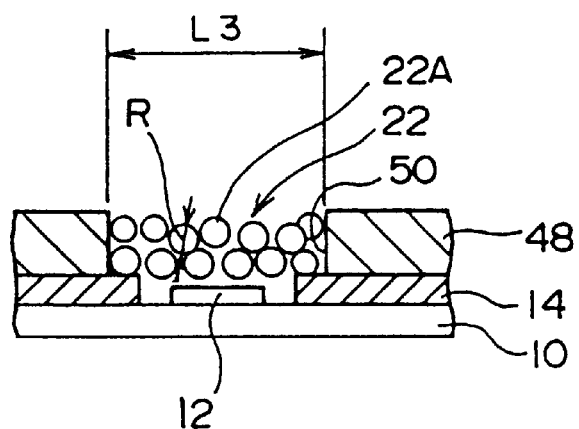
FIG. 17 is a cross-sectional diagram showing solder paste used in the first embodiment of the method of forming preformed solder bumps according to the present invention.

Referring now to FIG. 17, the solder paste 22 used in the present embodiment is described. Solder particles 22A are mixed in the flux made of an organic material so as to form the solder paste 22. Here, a diameter of the solder particles 22A in the solder paste 22 is represented by R and a diameter of the mask opening 50 is represented by L3. The present embodiment is characterized in that the relationship between the diameter R and the diameter L3 can be expressed as $L3/8 < R < L3/5$.

The filling efficiency of the solder paste 22 in the mask opening 50 may be improved by providing the solder particles 22A having the diameter R which satisfies the above relationship. That is to say, when the diameter R of the solder particles 22A is too large, considerably great gaps may occur between the neighboring particles. This may cause the filling amount of the solder to be insufficient. In a case where the diameter R of the solder particles 22A is too small, the filling amount of the solder increases, but the fluidity will decrease. Thus, the solder paste 22 will not be sufficiently filled in the mask opening 50. Therefore, the filling amount of the solder will also be insufficient.

From the result of an experiment carried out by the inventors, it can be seen that the above two problems can be solved when the diameter R of the solder particles 22A satisfies the above-described relationship $L3/8 < R < L3/5$. FIG. 17 shows a state where the mask opening 50 is filled with the solder paste 22. Thus, the filling efficiency of the solder paste 22 in the mask opening 50 is improved.

Accordingly, the preformed solder bumps 40 formed by heating the solder paste 22 can be uniform (the number of the preformed solder bumps thus formed depends on the number of the solder bumps 46). This can improve the reliability in mounting the solder bumps 46.

Figure 18:
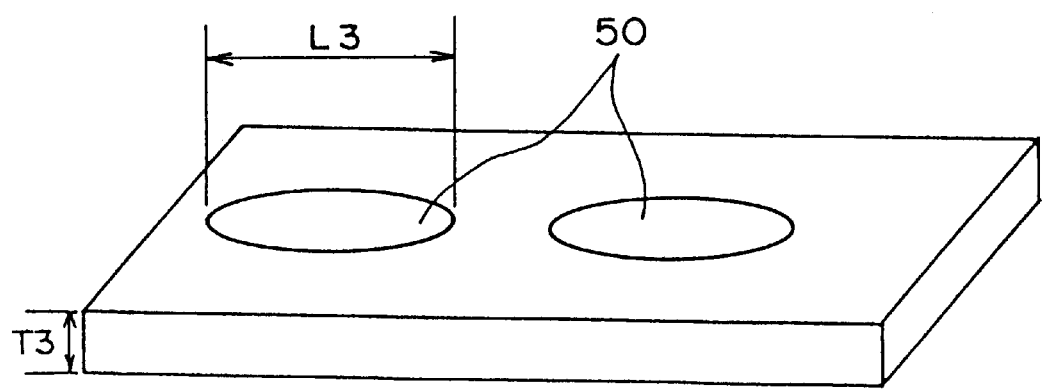
FIG. 18 is a perspective view of a mask used in the first embodiment of the method of forming preformed solder bumps according to the present invention.
Figure 19:
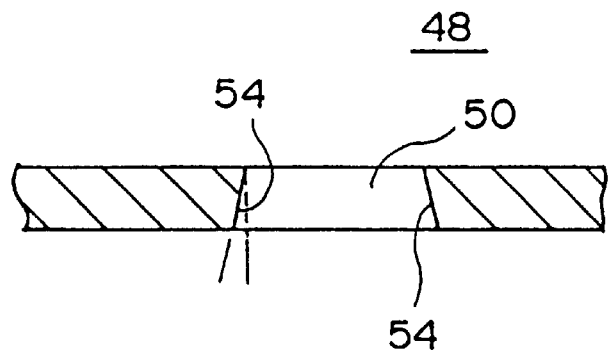
FIG. 19 is a cross-sectional diagram of a mask used in the first embodiment of the method of forming preformed solder bumps according to the present invention.

FIGS. 18 and 19 are cross-sectional diagrams showing the mask 48 for the preformed solder bumps 40, which is used in the present embodiment. In a similar manner as the first mask 18 described with reference to FIG. 7, a thickness of the mask 48 is represented by T3 and a diameter of the mask opening 50 is represented by L3. The relationship between the thickness T3 and the diameter L3 can be expressed as $1.5 \times T3 < L3$.

As has been described with reference to FIG. 7, the above relationship is determined in order to improve the filling efficiency of the solder paste 22 in the mask opening 50. Any further description for the improvement of the filling efficiency of the solder paste 22 will be omitted since it has been described above.

After the above-described solder paste printing step, the mask 48 for the preformed solder bumps 40 is removed from the board 10 and the board 10 is subjected to the heating step.

In order to facilitate the removal of the mask 48 from the board 10, the mask opening 50 may have a tapered surface 54 as shown in FIG. 19. Thus, the solder paste 22 is prevented from remaining on the mask 48 upon removal. The most effective angle of inclination of the tapered surface 54 is, for example, 2° to 3°.

Figure 20:
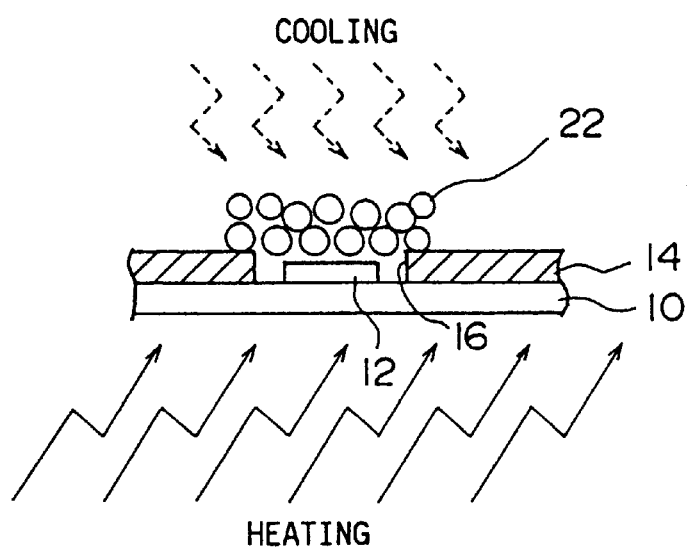
FIG. 20 is a schematic diagram showing a heating step of the first embodiment of the method of forming preformed solder bumps according to the present invention.

FIG. 20 is a diagram showing a heating step of the present embodiment. The present embodiment is characterized in that the lower surface of the board 10 is heated while the upper surface of the board 10 is cooled or kept at a constant temperature. Thus, it is possible to avoid any void in the preformed solder bump 40 by heating the lower surface of the board 10. This will be described below.

As has been described, the surface of the pad 12 is slightly rough. Therefore, when the solder paste 22 is provided on the top surface of the pad 12, the air existing at the rough surface will be sealed by the solder paste 22. Also, if the heat is applied to the top surface of the board 10 as in the general heating step, the flux of the solder paste 22 starts evaporating from the upper part and the solder particles will melt at the top of the solder paste 22. Therefore, the air at the surface of the pad 12 may not be released in such a heating step, and thus the void is produced.

On the contrary, when the lower surface of the board 10 is heated as in the present embodiment, the flux in the solder paste 22 will evaporate from the lower part, and will escape via the solder paste 22 on top which is still in a liquid form. In other words, a passage is formed in the solder paste 22 for the evaporated flux to pass through. The air at the surface of the pad 12 will also escape out of the solder paste 22 via this passage.

Generally, the melting point of the solder particle is higher than the evaporation point of the flux. Thus, after the air at the surface of the pad 12 has escaped out of the solder paste 22, the solder particles will melt and join with the pad 12. Then, there will be no air existing at the surface of the pad 12. Therefore, by implementing a heating step according to the present embodiment, the void is prevented from being produced in the preformed solder bump 40.

The heating step is followed by the flattening step. Immediately after the heating step, the preformed solder bump 40 has a spherical shape due to the surface tension during fusion of the solder particles. When the surface of the preformed solder bump 40 has a spherical shape, the height of the preformed solder bump 40 measured from the board surface will not be uniform. Therefore, the mounting ability of the preformed solder bump 40 is reduced against the solder bump 46. The flattening step is implemented in order to level the height of the preformed solder bump 40 measured from the board surface.

Figure 21:
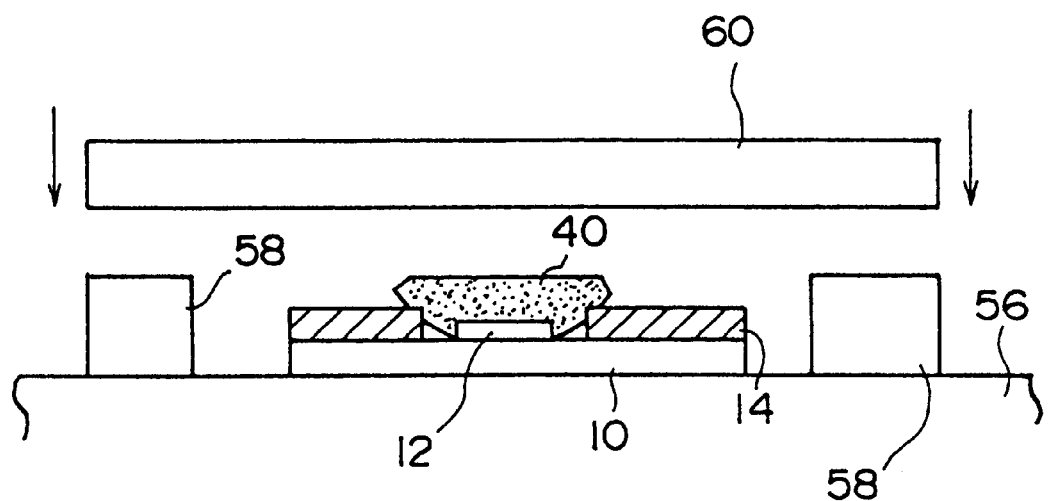
FIGS. 21 and 22 are cross-sectional diagrams showing a flattening step implemented after completion of the heating step.
Figure 22:
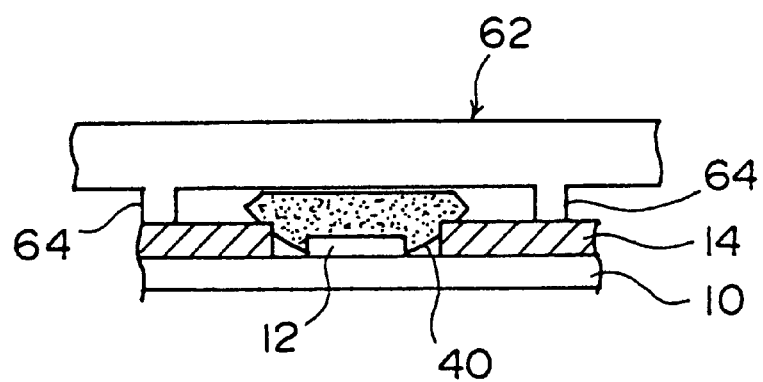

FIGS. 21 and 22 show a flattening step in detail. In a method shown in FIG. 21, a board is placed on a flat table 56 and a height restricting part 58 is placed around the board 10. The height of the height restricting part 58 corresponds to the predetermined height of the preformed solder bump 40.

As shown in FIG. 21, the preformed solder bump 40 is pressed by descending a flattening member 60 placed above the board 10, having a flat-plate shape, towards the height limiting part 58. This causes a plastic deformation of the upper surface of the preformed solder bump 40. The upper surface of the preformed solder bump 40 is thus flattened. Also, the preformed solder bump 40 has a predetermined height since the descending motion of the flattening member 60 is limited by touching the height limiting part 58.

FIG. 22 shows a method of implementing a flattening step on the preformed solder bump 40 without using the table 56, in which method the height limiting part 58 is characterized by using a flattening member 62 provided with leg parts 64. The flattening member 62 limits the height of the preformed solder bump 40 when the legs 64 of the flattening member 62 touch the top surface of the resist 14 formed on the board 10. The flattening step may be easily implemented in the method using the flattening member 62 since there is no need for other tools.

The preformed solder bump 40 shown in FIG. 14 may be formed by implementing either one of the above-described processes. Then, when mounting the semiconductor chip, the joining force between the solder bump 46 formed on the semiconductor chip 42 and the pad 12 can be improved.

Referring to FIGS. 23A and B, a second embodiment of a method of forming preformed solder bumps according to the present invention will be described. FIG. 23A shows a cross-sectional diagram after completion of the solder paste printing step for describing the second embodiment of the method of forming preformed solder bumps. For the sake of the convenience of the description, FIG. 23B shows a cross-sectional diagram after completion of the solder paste printing step of the method of forming preformed solder bumps described in the first embodiment.

Th present embodiment is characterized in that the mask opening 50 is displaced from the resist opening 16 when providing the mask 48 for the preformed solder bumps on the board 10 in the solder paste printing step.

In FIG. 23A, the mask 48 of the present embodiment is displaced by an amount X1 compared to the position of the mask 48 in the first embodiment of the method of forming preformed solder bumps. By providing the mask 48 at a displaced position, the void may be prevented from being formed in the preformed solder bump when forming the preformed solder bump by fusing the solder paste 22 in the heating step. This will be described in the following.

When the solder paste 22 is printed such that the resist opening 16 and the mask opening 50 are laminated without any displacement (see FIG. 23B), the solder paste 22 will be printed on the entire surface of the pad 12. Therefore, the air at the surface of the pad 12 will be sealed and the void will be formed in the preformed solder bump in the heating step.

On the contrary, by providing the mask opening 50 at a position displaced from the resist opening (see FIG. 23A), the pad 12 will not be covered with the solder paste 22 after the solder paste printing step. Then, in the heating step, the solder particles in the solder paste 22 are fused. This causes the fused solder to flow towards the pad 12 from the side of the pad 12. Thus the preformed solder bump 40 is formed on the pad 12.

Since the fused solder flows towards the pad 12 from the side, the air existing on the top surface of the pad 12 will be pushed away by the solder. Thereby, the void is prevented from being formed in the preformed solder bump 40 and a high-quality preformed solder bump 40 is formed.

Now, a method of forming a single-layered solder bump on the mounting board, and a structure for mounting a semiconductor chip on the mounting board using such solder bump will be described.

Figure 24A:
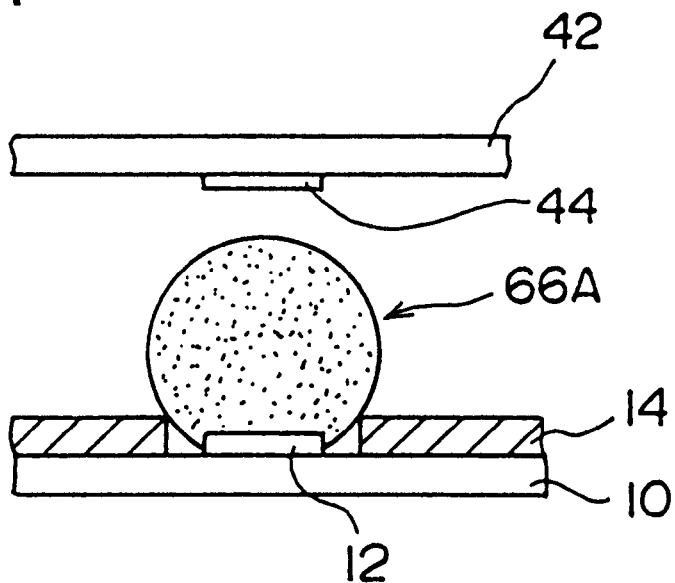
FIGS. 24A and 24B are cross-sectional diagrams showing a first embodiment of a method of forming a solder bump on a board whereon a semiconductor chip is mounted according to the present invention.
Figure 24B:
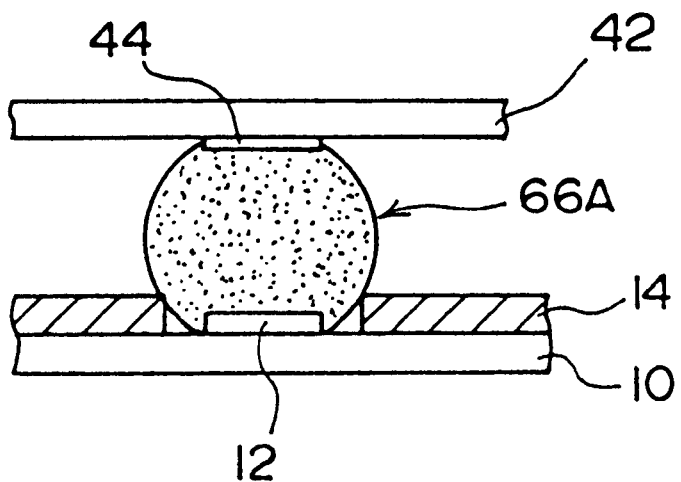

FIGS. 24A and B are diagrams showing a solder bump 66A formed on the pad 12 by implementing the solder paste printing step and the heating step against the mounting board 10 as in the above-described embodiments, or by using a solder ball. In the present embodiment, the semiconductor chip 42 is provided with an electrode 44 only, and there are no solder bumps or preformed solder bumps formed thereon.

Accordingly, it is possible to simplify a manufacturing process for forming the semiconductor chip 42 and to reduce the cost of the semiconductor chip 42. Also, on the pad 12 of the board 10, generally, the solder plating or preformed solder bump 40 described referring to FIG. 14 may be provided. Thus by forming the solder bump 66A instead of forming the solder plating or the preformed solder bump 40, the board 10 having the solder bumps 66A can be manufactured without increasing the manufacturing processes of the board.

The semiconductor chip 42 is mounted on the board 10 by implementing steps which are similar to those of the known flip-chip mounting. First, an electrode 44 of the semiconductor chip 42 and the solder bump 66A of the board 10 are brought in contact. Then, the electrode 44 and the solder bump 66A are joined together by implementing the heating step. Therefore, no additional apparatus is required in this mounting process. Thus, the mounting process may be implemented with a low cost.

Figure 25:
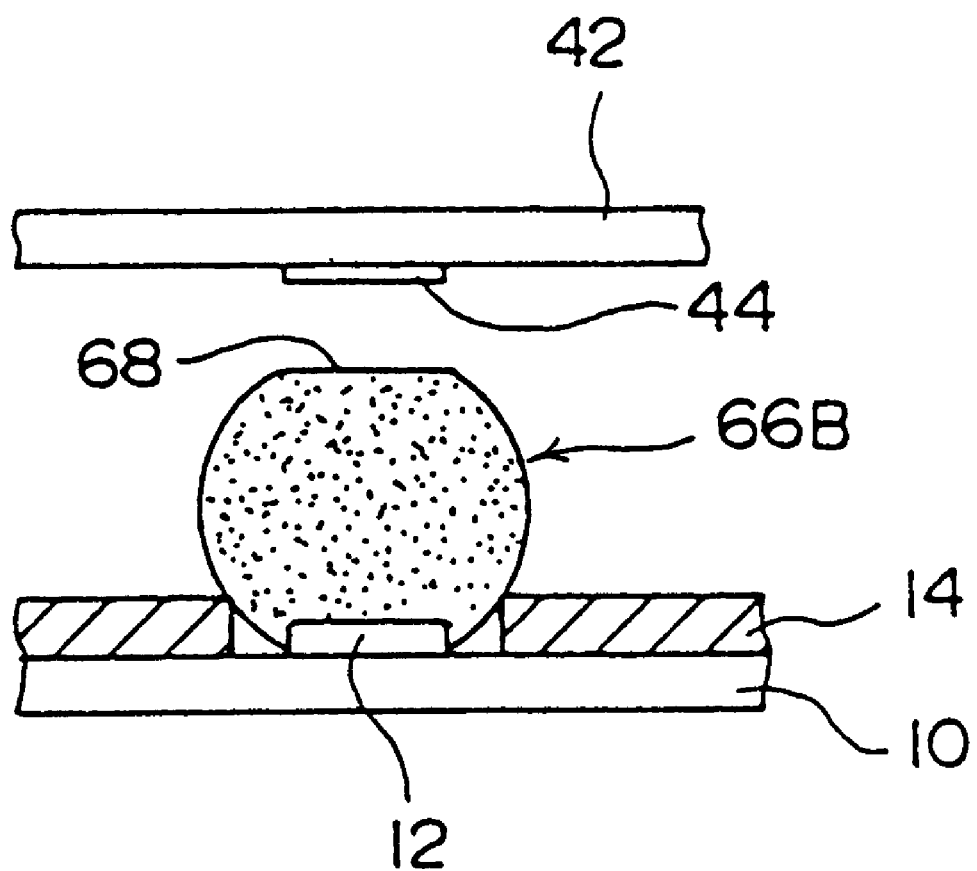
FIG. 25 is a cross-sectional diagram showing a second embodiment of the method of forming a solder bump on a board whereon a semiconductor chip is mounted according to the present invention.

FIG. 25 is a diagram showing a method of forming and mounting solder bumps of the second embodiment. The present embodiment is characterized in that a flat surface 68 is formed by implementing a flattening step on the top surface of the solder bump 66A formed on the board 10. Thus by forming the flat surface 68 on the top surface of the solder bump 66A, the joining force against the electrode 44 is improved in the mounting process.

Figure 26:
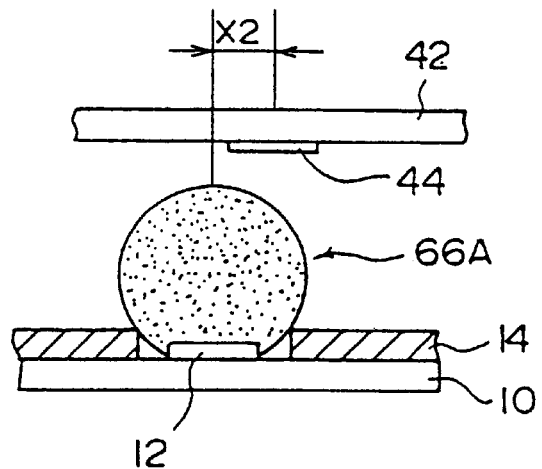
FIG. 26 is a cross-sectional diagram showing a third embodiment of the method of forming a solder bump on a board whereon a semiconductor chip is mounted according to the present invention.

FIG. 26 is a diagram showing a method of forming and mounting solder bumps of a third embodiment. The present embodiment is characterized in that the electrode 44 is joined to the solder bump 66A such that it is displaced from the position of the solder bump (In FIG. 26, the amount of displacement is shown by X2). With this structure, in a similar manner to that described with reference to FIGS. 23A and B, the air existing at the surface of the electrodes 44 may be removed when the solder bump 66A is fused in the heating step implemented during the mounting process. Thereby, the void is prevented from being produced in the solder bump 66A after the mounting process.

Figure 27:
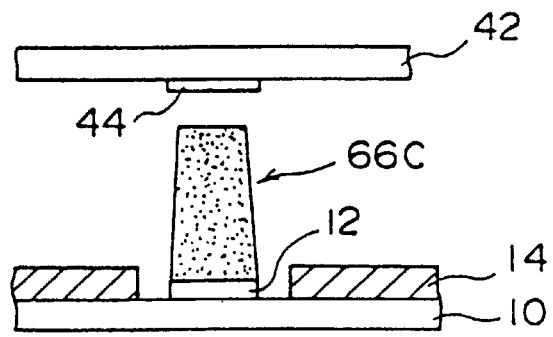
FIGS. 27 to 29 are cross-sectional diagrams showing a structure of a solder bump formed on a board whereon a semiconductor chip is mounted.
Figure 28:
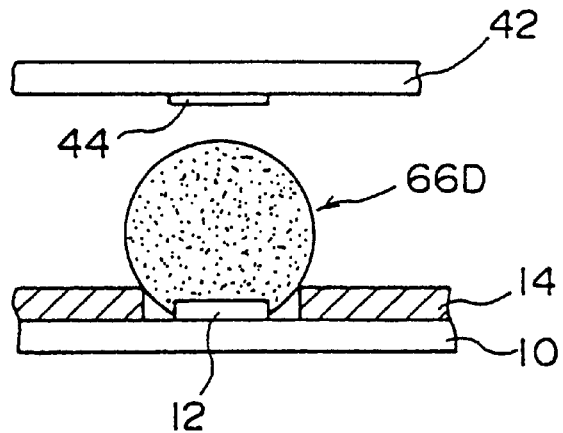
Figure 29:
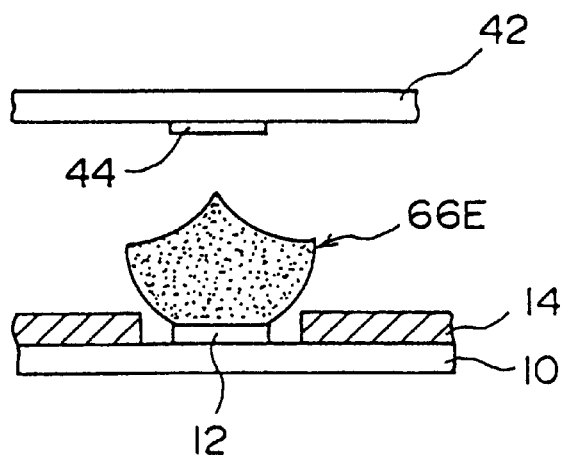

FIGS. 27 to 29 are diagrams showing various bump structures, which may be applied, to the present embodiment.

FIG. 27 shows a structure where a solder bump 66C is formed of a copper post. The solder bump 66C may be formed using plating. Also, a pre-formed copper post may be joined on the pad 12.

FIG. 28 shows a structure where a solder bump 66D is formed of a gold ball or a copper ball. FIG. 29 shows a structure where the solder bump 66E is a stud bump formed by wire bonding.

FIGS. 30A to D are diagrams showing various bump forms which may be applied to the present embodiment.

Figure 30A:
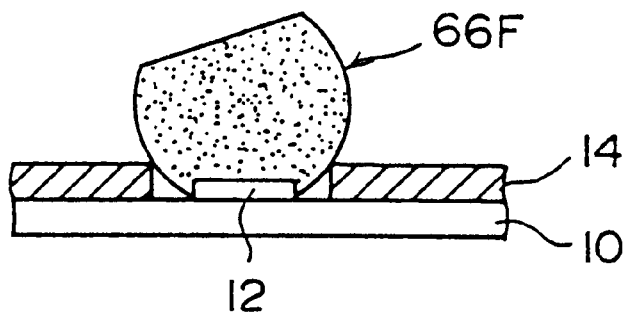
FIGS. 30A to 30D are cross-sectional diagrams showing different shapes of an upper part of a solder bump formed on a board whereon a semiconductor chip is mounted.
Figure 30B:
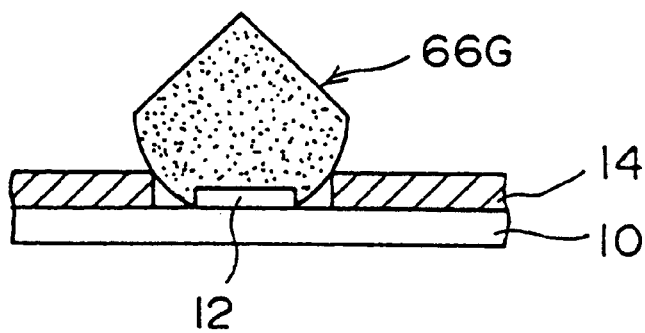
Figure 30C:
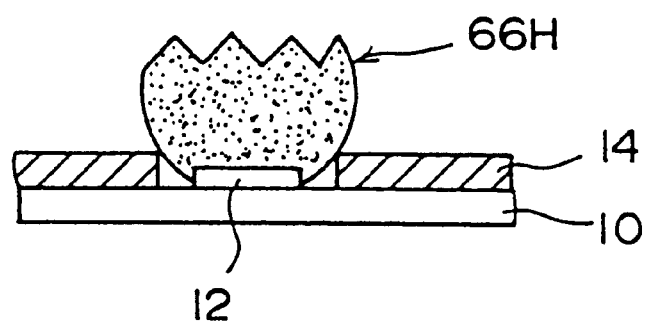
Figure 30D:
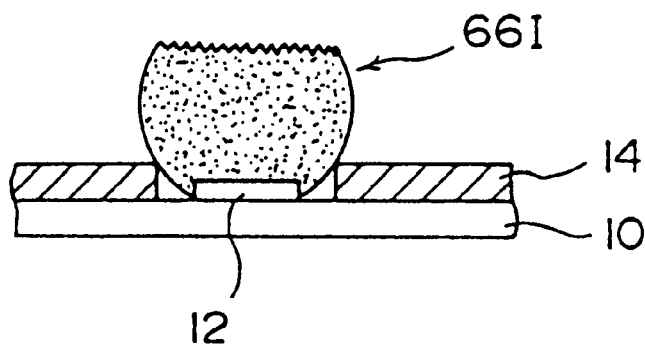

FIG. 30A is a diagram showing a solder bump 66F having an inclined top surface. FIG. 30B is a diagram showing a solder bump 66G having a peak at the top surface. FIG. 30C is a diagram showing a solder bump 66H having a saw-toothed top surface. FIG. 30D is a diagram showing a solder bump 66I having a rough top surface.

With the solder bumps 66F to 66I shown in FIGS. 30A to D, an effect similar to the effect described above with reference to FIGS. 23A and B can be achieved without displacing the position of the electrode and the solder bumps 66F to 66I. Therefore, any void can be prevented from being produced in the solder bumps 66F to 66I in the mounting process.

Further, the present invention is not limited to these embodiments, but variations and modifications may be made without departing from the scope of the present invention.

The present application is based on Japanese priority application No. 09-308802 filed on Nov. 11, 1997, the entire contents of which are hereby incorporated by reference.

What is claimed is:

1. A method of forming multilayered solder bumps on pads provided on a board, wherein a plurality of solder bump layer forming cycles are repeatedly implemented on the same board using a plurality of masks, each of said solder bump layer forming cycles comprising the steps of:

a) printing solder paste on said board using a mask having a mask openings; and b) heating said solder paste so as to fuse said solder paste for forming solder bumps.

2. A method of forming solder bumps on pads provided on a board, wherein a plurality of solder bump layer forming cycles are repeatedly implemented on said board, each of said solder bump layer forming cycles comprising the steps of:

a) printing solder paste on said board using a mask having a mask openings;

b) heating said solder paste so as to fuse said solder paste for forming solder bumps; and c) flattening an upper surface of said solder bump layer after said step b).

3. The method of forming solder bumps as claimed in claim 2, wherein the thickness of said mask is different between each cycle of said solder bump layer forming cycles.

4. The method of forming solder bumps as claimed in claim 3, wherein the thickness of at least said mask used in the first solder bump layer forming cycle is smaller than a thickness of said mask used in the subsequent solder bump layer forming cycles.

5. The method of forming solder bumps as claimed in claim 2, wherein the characteristics of said solder paste are different between each cycle of said solder bump layer forming cycles.

6. The method of forming solder bumps as claimed in claim 5, wherein a fluidity of said solder paste is increased as the number of cycles of repetition of said solder bump layer forming cycles increases.

7. The method of forming solder bumps as claimed in claim 2, wherein the area of the mask openings of said mask is different between each cycle of said solder bump layer forming cycles.

8. The method of forming solder bumps as claimed in claim 7, wherein the area of said mask opening is reduced as the number of cycles of repetition of said solder bump layer forming cycles increases.

* * * * *